(12) United States Patent
Heo et al.

(10) Patent No.: US 11,701,728 B2
(45) Date of Patent: Jul. 18, 2023

(54) LOGIC SWITCHING DEVICE AND METHOD OF MANUFACTURING THE SAME

(71) Applicant: Samsung Electronics Co., Ltd., Suwon-si (KR)

(72) Inventors: Jinseong Heo, Seoul (KR); Yunseong Lee, Osan-si (KR); Sanghyun Jo, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 17/722,746

(22) Filed: Apr. 18, 2022

(65) Prior Publication Data

US 2022/0241884 A1 Aug. 4, 2022

Related U.S. Application Data

(63) Continuation of application No. 16/881,377, filed on May 22, 2020, now Pat. No. 11,305,365, which is a
(Continued)

(30) Foreign Application Priority Data

Aug. 20, 2018 (KR) .................. 10-2018-0096828
Jan. 22, 2019 (KR) .................. 10-2019-0008347

(51) Int. Cl.
*B23K 3/08* (2006.01)
*B23K 3/06* (2006.01)
(Continued)

(52) U.S. Cl.
CPC .............. *B23K 3/08* (2013.01); *B23K 3/0607* (2013.01); *H01L 24/26* (2013.01); *H01L 29/6684* (2013.01); *H10B 51/00* (2023.02)

(58) Field of Classification Search
CPC ......... B23K 3/08; B23K 3/0607; H01L 24/26; H01L 29/6684; H01L 29/512;
(Continued)

(56) References Cited

U.S. PATENT DOCUMENTS 6,344,991 B1 2/2002 Mikami et al.
7,709,359 B2 * 5/2010 Boescke ............... H01L 29/513
438/785
(Continued)

FOREIGN PATENT DOCUMENTS

CN       100550391 C    10/2009
JP       2017-059751 A   3/2017
(Continued)

OTHER PUBLICATIONS

Dünkel, S. et al. "A FeFET based super-low-power ultra-fast embedded NVM technology for 22nm FDSOI and beyond." IEEE, 2017.
(Continued)

*Primary Examiner* — Allison Bernstein
(74) *Attorney, Agent, or Firm* — Harness, Dickey & Pierce, P.L.C.

(57) ABSTRACT

Provided are a logic switching device and a method of manufacturing the same. The logic switching device may include a domain switching layer adjacent to a gate electrode. The domain switching layer may include a ferroelectric material region and an anti-ferroelectric material region. The domain switching layer may be a non-memory element. The logic switching device may include a channel, a source and a drain both connected to the channel, the gate electrode arranged to face the channel, and the domain switching layer provided between the channel and the gate electrode.

24 Claims, 15 Drawing Sheets

Related U.S. Application Data continuation of application No. 16/391,477, filed on Apr. 23, 2019, now Pat. No. 10,702,940.

(51) Int. Cl.
  *H01L 23/00*   (2006.01)
  *H01L 29/66*   (2006.01)
  *H10B 51/00*   (2023.01)

(58) Field of Classification Search
  CPC ............ H01L 29/513; H01L 29/78391; H01L 29/516; H01L 29/78; H01L 29/0603; H01L 29/0684; H01L 29/66477; H01L 29/7841; H10B 51/00; H10B 51/30
  See application file for complete search history.

(56) References Cited

U.S. PATENT DOCUMENTS

| | | | |
|---|---|---|---|
| 9,830,969 | B2 | 11/2017 | Slesazeck et al. |
| 10,056,393 | B2 | 8/2018 | Schroder et al. |
| 10,096,619 | B2 | 10/2018 | Ino et al. |
| 10,374,054 | B2 * | 8/2019 | Yoo ............... H01L 29/6684 |
| 10,714,500 | B2 | 7/2020 | Heo et al. |
| 2017/0162250 | A1 | 6/2017 | Slesazeck et al. |
| 2017/0345831 | A1 | 11/2017 | Chavan et al. |
| 2017/0358684 | A1 | 12/2017 | Chen et al. |
| 2017/0365719 | A1 | 12/2017 | Chen et al. |
| 2018/0233573 | A1 | 8/2018 | Lin et al. |
| 2018/0366476 | A1 | 12/2018 | Liu |
| 2018/0374929 | A1 | 12/2018 | Yoo |
| 2019/0296122 | A1 | 9/2019 | Ino et al. |

FOREIGN PATENT DOCUMENTS

| | | |
|---|---|---|
| JP | 6096902 B2 | 3/2017 |
| KR | 100430656 B1 | 5/2004 |

OTHER PUBLICATIONS

Fan, Chia-Chi et al. "Energy-Efficient HfAlO$_x$ NCFET: Using Gate Strain and Defect Passivation to Realize Nearly Hysteresis-Free Sub-25mV/dec Switch with Ultralow Leakage." IEEE, 2017.

Ota, Hiroyuki et al. "Perspective of Negative Capacitance FinFETs Investigated by Transient TCAD Simulation." IEEE, 2017.

T.S. Böscke et al., "Ferroelectricity in Hafnium Oxide: CMOS compatible Ferroelectric Field Effect Transistors", Electron Devices Meeting (IEDM), 2011 IEEE International, IEEE, Dec. 5, 2011, 4 pages, XP032095998.

Extended European Search Report for corresponding Application No. 19192485.1, dated Jan. 13, 2020.

Office Action dated Aug. 19, 2021 for corresponding U.S. Appl. No. 16/881,377.

Office action dated Jan. 2, 2023 for corresponding EP Patent Application No. 19192485.1.

Lee M H et al: "Steep Slope and Near None-Hysteresis of FETs With Antiferroelectric-Like HfZrO for Low-Power Electronics", IEEE Electron Device Letters, IEEE, USA, vol. 36, No. 4, (Apr. 1, 2015), pp. 294-296, XP011576474.

Saeidi Ali et al: "Negative capacitance field effect transistors; capacitance matching and non-hysteretic operation", 2017 47th European Solid-State Device Research Conference (ESSDERC), IEEE, (Sep. 11, 2017), pp. 78-81, XP033165396.

Asif Khan et al: "Ferroelectric negative capacitance MOSFET: Capacitance tuning & antiferroelectric operation", Electron Devices Meeting (IEDM), 2011 IEEE International, IEEE, (Dec. 5, 2011), pp. 11.3.1-11.3.4, XP032095924.

* cited by examiner

< Ferro + Anti-ferro >

< Dielectric >

LOGIC SWITCHING DEVICE AND METHOD OF MANUFACTURING THE SAME

CROSS-REFERENCE TO RELATED APPLICATIONS

This application is a continuation of U.S. application Ser. No. 16/881,377, filed May 22, 2020, which claims the benefit of U.S. application Ser. No. 16/391,477, filed Apr. 23, 2019, which claims the benefit of Korean Patent Application No. 10-2018-0096828, filed on Aug. 20, 2018 and Korean Patent Application No. 10-2019-0008347, filed on Jan. 22, 2019, in the Korean Intellectual Property Office, the disclosures of which are incorporated herein in their entireties by reference.

BACKGROUND

1. Field

The present disclosure relates to logic switching devices and methods of manufacturing the same.

2. Description of the Related Art

Improving the operating characteristics and scaling down of existing silicon-based transistors are limited. For example, when an operating voltage and current characteristics of the existing silicon-based transistors are measured, a subthreshold swing (SS) value is determined according to the following equation. A subthreshold swing (SS) value is known to be a limit of about 60 mV/dec.

$$SS = \frac{k_B T}{q} \ln(10) \left(1 + \frac{C_D}{C_{ins}}\right)$$

In the above equation, $k_B$ is a Boltzmann constant, T is an absolute temperature, q is an elementary charge, $C_D$ is a capacitance of a depletion layer, and $C_{ins}$ is a capacitance of a gate insulator.

As the size of the transistors decreases, a power density increases due to factors that make it difficult to lower the operating voltage to about 0.8 V or less. Therefore, scaling down of devices is limited.

SUMMARY

Provided is a logic switching device using a negative capacitance effect. Provided is a logic switching device using a ferroelectric material and an anti-ferroelectric material. Provided is a logic switching device with improved operating characteristics such as subthreshold swing (SS) and/or increased control efficiency and/or advantageous for scaling down. Provided is a method of manufacturing the logic switching device.

Additional aspects will be set forth in part in the description which follows and, in part, will be apparent from the description, or may be learned by practice of the presented example embodiments.

According to an aspect of at least one example embodiment, a logic switching device includes: a channel; a source and a drain both connected to the channel; a gate electrode arranged to face the channel; and a domain switching layer between the channel and the gate electrode, wherein the domain switching layer is a non-memory element and includes at least one structure including at least one ferroelectric material region including a ferroelectric domain and at least one anti-ferroelectric material region including an anti-ferroelectric domain.

The domain switching layer may have substantially a non-hysteretic behavior characteristic at a polarization change according to an external electric field.

The domain switching layer may include the at least one ferroelectric material region and the at least one anti-ferroelectric material region arranged in a direction parallel to the gate electrode.

The domain switching layer may include the at least one ferroelectric material region and the at least one anti-ferroelectric material region arranged in a direction perpendicular to the gate electrode.

The domain switching layer may include at least two structures, a first structure including at least one ferroelectric material region and at least one anti-ferroelectric material region arranged in a direction parallel to the gate electrode and a second structure including at least one ferroelectric material region and at least one anti-ferroelectric material region arranged in a direction perpendicular to the gate electrode.

The at least one ferroelectric material region and the at least one anti-ferroelectric material region may include an identical base material, but have different crystalline phases.

The at least one ferroelectric material region may have an orthorhombic crystalline phase, and the at least one anti-ferroelectric material region may have a tetragonal crystalline phase.

The at least one ferroelectric material region and the at least one anti-ferroelectric material region may have different doping concentrations.

The at least one ferroelectric material region and the at least one anti-ferroelectric material region may include different dopants.

At least one of the at least one ferroelectric material region and the at least one anti-ferroelectric material region may include at least one of a Hf-based oxide or a Zr-based oxide.

At least one of the at least one ferroelectric material region and the at least one anti-ferroelectric material region may include a dopant, wherein the dopant may include at least one of silicon (Si), aluminum (Al), zirconium (Zr), yttrium (Y), lanthanum (La), gadolinium (Gd), strontium (Sr), and hafnium (Hf).

A volume ratio of the at least one ferroelectric material region to the at least one anti-ferroelectric material region in the domain switching layers may be in a range from about 10:90 to about 90:10.

The domain switching layer may be in direct contact with the channel.

The logic switching device may further include an insulating layer between the channel and the domain switching layer.

The logic switching device may further include an insulating layer between the channel and the domain switching layer; and a conductive layer between the insulating layer and the domain switching layer.

The channel may include at least one of Si, germanium (Ge), silicon-germanium (SiGe), a Group III-V semiconductor, an oxide semiconductor, a nitride semiconductor, an oxynitride semiconductor, a two-dimensional (2D) material, a quantum dot, and an organic semiconductor.

According to an aspect of at least one example embodiment, a method of manufacturing a logic switching device includes: preparing a substrate including a channel; forming an amorphous thin film on the channel; forming a conductive material layer on the amorphous thin film; and annealing the amorphous thin film to form a domain switching layer from the amorphous thin film, wherein the domain switching layer is a non-memory element and includes at least one ferroelectric material region including a ferroelectric domain and at least one anti-ferroelectric material region including an anti-ferroelectric domain.

The at least one ferroelectric material region and the at least one anti-ferroelectric material region may have different crystalline phases.

The at least one ferroelectric material region may have an orthorhombic crystalline phase, and the at least one anti-ferroelectric material region may have a tetragonal crystalline phase.

The at least one ferroelectric material region and the at least one anti-ferroelectric material region may have different doping concentrations.

The at least one ferroelectric material region and the at least one anti-ferroelectric material region may include different dopants.

At least one of the at least one ferroelectric material region and the at least one anti-ferroelectric material region may include at least one of a Hf-based oxide or a Zr-based oxide.

The annealing may be performed at a temperature in the range from about 400° C. to about 1200° C.

The method may further include forming a gate electrode from the conductive material layer.

The method may further include forming a source and a drain both connected to the channel.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
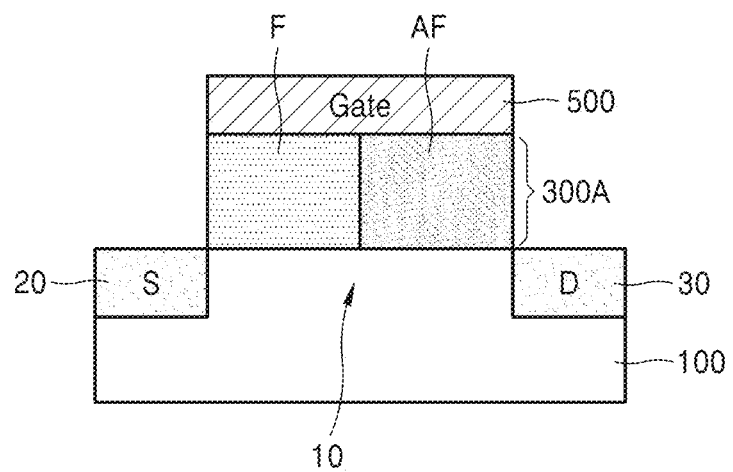
FIG. 1 is a cross-sectional view of a logic switching device according to at least one example embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a logic switching device and a method of manufacturing the same according to various embodiments will be described with reference to the accompanying drawings. The width and thickness of layers or elements illustrated in the accompanying drawings may be somewhat exaggerated for convenience and clarity of description. Like reference numerals refer to like elements throughout the detailed description.

FIG. 1 is a cross-sectional view of a logic switching device according to at least one example embodiment. The logic switching device may be a logic transistor. The term 'logic switching device' is a concept comparable to a memory device (memory transistor), and may refer to an ON/OFF non-memory switching device.

Referring to FIG. 1, the logic switching device may include a channel 10, and a source 20 and a drain 30 that are both electrically connected to the channel 10. The source 20 may be electrically connected/contacted to a first region of the channel 10 and the drain 30 may be electrically connected/contacted to a second region of the channel 10. The channel 10, the source 20, and/or the drain 30 may be provided in a substrate 100. The source 20 and the drain 30 may be formed by implanting impurities into different regions of the substrate 100 and a region of the substrate 100 between the source 20 and the drain 30 may be defined as the channel (channel element or channel region) 10. The substrate 100 may be, for example, a silicon (Si) substrate. In another example, the substrate 100 may be a substrate including a material other than Si, for example, germanium (Ge), silicon-germanium (SiGe), a Group III-V semiconductor, or the like. In this case, the channel 10 may include Si, Ge, SiGe or a Group III-V semiconductor. The material of the substrate 100 is not limited to those described above and may vary. In addition, the channel 10 may be provided as a separate material layer (thin film) from the substrate 100, not as a part of the substrate 100. In at least one example embodiment, a material composition of the channel 10 may vary. For example, the channel 10 may include at least one of an oxide semiconductor, a nitride semiconductor, an oxynitride semiconductor, a two-dimensional (2D) material, a quantum dot, and an organic semiconductor. The oxide semiconductor may include, for example, InGaZnO or the like, and the 2D material may include, for example, transition metal dichalcogenide (TMD) or graphene, and the quantum dot may include a colloidal quantum dot (QD), a nanocrystal structure, or the like. However, these are merely examples and the example embodiments are not limited thereto.

The logic switching device may further include a gate electrode 500 arranged to face the channel 10. The gate electrode 500 may be spaced apart from the channel 10 between the source 20 and the drain 30. The logic switching device may further include a domain switching layer 300A between the channel 10 and the gate electrode 500. The domain switching layer 300A may be a non-memory element. The domain switching layer 300A may include a ferroelectric material region F including a ferroelectric domain and an anti-ferroelectric material region AF including an anti-ferroelectric domain. According to a combination of the ferroelectric material region F and the anti-ferroelectric material region AF, the domain switching layer 300A may have substantially a non-hysteretic behavior characteristic in a polarization change according to an external electric field. In other words, the domain switching layer 300A may have substantially no hysteresis characteristic.

A ferroelectric material has a spontaneous dipole (electric dipole), that is, spontaneous polarization because charge distribution in a unit cell is non-centrosymmetric in a crystallized material structure. The ferroelectric material has remnant polarization due to a dipole even in the absence of the external electric field. In addition, the polarization direction of the ferroelectric material may be switched in domain units by applying an external electric field to the ferroelectric material.

An anti-ferroelectric material may include an array of electrical dipoles, but the remnant polarization may be zero or close to zero. In the absence of an electric field, the directions of adjacent dipoles are opposite each other and the polarization thereof cancel each other so that the overall spontaneous polarization and remnant polarization of the anti-ferroelectric material may be zero or close to zero. However, the anti-ferroelectric material may exhibit a polarization characteristic and a switching characteristic when an external electric field is applied thereto.

In at least one example embodiment, the domain switching layer 300A may be made to have no hysteresis characteristic by performing capacitance matching using a combination of at least one ferroelectric material region F and at least one anti-ferroelectric material region AF that are in contact with each other. Therefore, domain switching occurs in each of the ferroelectric material region F and at least one anti-ferroelectric material region AF and a switching characteristic of the logic switching device (logic transistor) may be improved by voltage amplification occurring during the domain switching. For example, an effect of further lowering a subthreshold swing (SS) value of the logic switching device (logic transistor) may be obtained. Since the domain switching layer 300A has a non-hysteretic behavior characteristic, an improved switching element with an ON/OFF non-memory characteristic may be obtained.

In addition, in the example embodiment of FIG. 1, the domain switching layer 300A may be in direct contact with the channel element 10. In at least one example embodiment, a separate dielectric layer need not be used between the channel 10 and the domain switching layer 300A, and characteristics deterioration due to a dielectric layer having a lower dielectric constant may be reduced or prevented.

FIG. 1 shows a case where the ferroelectric material region F and the anti-ferroelectric material region AF of the domain switching layer 300A are arranged in a direction parallel to the gate electrode 500, that is, the ferroelectric material region F and the anti-ferroelectric material region AF are laterally arranged. However, according to at least one example embodiment, the ferroelectric material region F and the anti-ferroelectric material region AF may have a structure arranged in a direction perpendicular to the gate electrode 500, that is, a structure vertically arranged. Examples thereof are shown in FIGS. 2 and 3.

Figure 2:
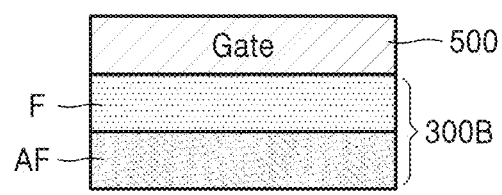
FIGS. 2 and 3 are cross-sectional views of a stack structure of a domain switching layer and a gate electrode applicable to a logic switching device, according to at least one example embodiment.
Figure 3:
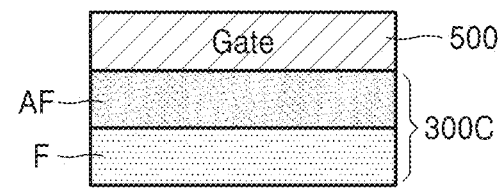

FIGS. 2 and 3 are cross-sectional views of a stack structure of a domain switching layer and a gate electrode applicable to a logic switching device, according to at least one example embodiment.

Referring to FIGS. 2 and 3, domain switching layers 300B and 300C may each include at least one ferroelectric material region F and at least one anti-ferroelectric material region AF arranged in a direction perpendicular to the gate electrode 500. In FIG. 2, the ferroelectric material region F is in contact with the gate electrode 500, and the anti-ferroelectric material region AF is provided under the ferroelectric material region F. In FIG. 3, the anti-ferroelectric material region AF is in contact with the gate electrode 500, and the ferroelectric material region F is provided under the anti-ferroelectric material region AF. The domain switching layers 300B and 300C of FIGS. 2 and 3 may be applied instead of the domain switching layer 300A of FIG. Even in the structures of FIGS. 2 and 3, capacitance matching is performed by the combination of the ferroelectric material region F and the anti-ferroelectric material region AF, so that the domain switching layers 300B and 300C may not have hysteresis characteristics.

Although FIG. 1 illustrates the case where the domain switching layer 300A is in direct contact with the channel 10, the lower structure under the domain switching layer 300A may be different. Examples thereof are shown in FIGS. 4 and 5.

Figure 4:
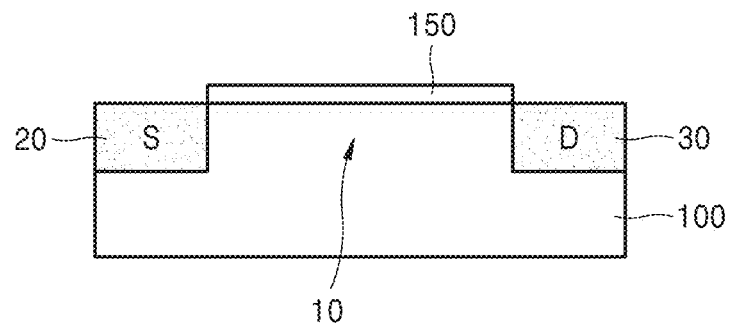
FIG. 4 is a cross-sectional view of a lower structure applicable under a domain switching layer of a logic switching device, according to at least one example embodiment.

FIG. 4 is a cross-sectional view of a lower structure applicable under a domain switching layer of a logic switching device, according to at least one example embodiment.

Referring to FIG. 4, an insulating layer 150 may be provided on the channel 10. The domain switching layers 300A, 300B, and 300C and the gate electrode 500 of FIGS. 1 to 3 may be on the insulating layer 150. A thickness of the insulating layer 150 may be as thin as about 5 nm or less or about 3 nm or less. However, the thickness of the insulating layer 150 is not limited to the above, and may be 5 nm or more. For the insulating layer 150, for example, a Si oxide, an Al oxide, a Hf oxide, a Zr oxide, or the like may be applied, or a 2D insulator such as hexagonal boron nitride (h-BN) may be used. However, the material of the insulating layer 150 may vary without being limited thereto. It is easy to apply a dielectric material having a relatively high dielectric constant to the insulating layer 150 because capacitance matching is performed using the ferroelectric material region F and the anti-ferroelectric material region AF. The higher a dielectric constant of the insulating layer 150, the better the performance of the logic switching device. Further, when the insulating layer 150 is used, an effect of suppressing or preventing electrical leakage may be obtained.

Figure 5:
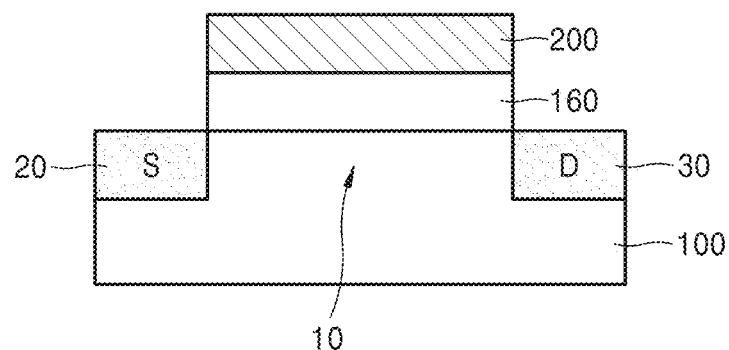
FIG. 5 is a cross-sectional view of a lower structure applicable under a domain switching layer of a logic switching device, according to at least one example embodiment.

FIG. 5 is a cross-sectional view of a lower structure applicable under a domain switching layer of a logic switching device, according to at least one example embodiment.

Referring to FIG. 5, an insulating layer 160 may be provided on the channel 10 and a conductive layer 200 may further be provided on the insulating layer 160. The domain switching layers 300A, 300B, and 300C and the gate electrode 500 of FIGS. 1 to 3 may be on the conductive layer 200. The material of the insulating layer 160 may be the same as or similar to the material of the insulating layer 150 of FIG. 1. The conductive layer 200 may be formed of a metal or a metal compound. The conductive layer 200 may be a floating electrode and may be involved in manufacturing processes and characteristics control of the domain switching layers 300A, 300B, and 300C. The insulating layer 160 may insulate the channel element 10 from the conductive layer 200 and may have a thickness of, for example, about 10 nm or more.

FIG. 1 shows the case where the domain switching layer 300A includes one ferroelectric material region F and one anti-ferroelectric material region AF. However, according to at least one example embodiment, a plurality of ferroelectric material regions F and a plurality of anti-ferroelectric material regions AF may constitute one domain switching layer. An example thereof is shown in FIG. 6.

Figure 6:
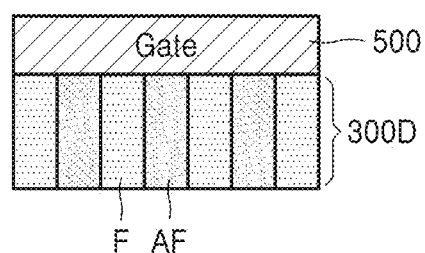
FIG. 6 is a cross-sectional view of a stack structure of a domain switching layer and a gate electrode applicable to a logic switching device, according to at least one example embodiment.

FIG. 6 is a cross-sectional view of a stack structure of a domain switching layer and a gate electrode applicable to a logic switching device, according to at least one example embodiment.

Referring to FIG. 6, a domain switching layer 300D may have a structure in which a plurality of ferroelectric material regions F and a plurality of anti-ferroelectric material regions AF are alternately arranged in a horizontal direction (laterally). The ratio and size of the ferroelectric material regions F and the anti-ferroelectric material regions AF are illustrative and may vary.

According to at least one example embodiment, the domain switching layer 300D may include a combination of a structure including at least one ferroelectric material region and at least one anti-ferroelectric material region that are arranged in a direction parallel to the gate electrode and a structure including at least one ferroelectric material region and at least one anti-ferroelectric material region that are arranged in a direction perpendicular to the gate electrode. An example thereof is shown in FIG. 7.

Figure 7:
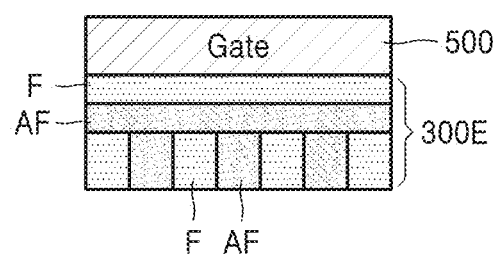
FIG. 7 is a cross-sectional view of a stack structure of a domain switching layer and a gate electrode applicable to a logic switching device, according to at least one example embodiment.

FIG. 7 is a cross-sectional view of a stack structure of a domain switching layer and a gate electrode applicable to a logic switching device, according to at least one example embodiment.

Referring to FIG. 7, a domain switching layer 300E may include a combination of a structure including the plurality of ferroelectric material regions F and the plurality of anti-ferroelectric material regions AF that are arranged in a horizontal direction (laterally) and a structure in which the plurality of ferroelectric material regions F and the plurality of anti-ferroelectric material regions AF are arranged in a vertical direction (vertically). Depending on the conditions of a manufacturing process, a combination of such arrangements may be formed. However, the structure of FIG. 7 is illustrative and may vary.

In the above example embodiments, the ferroelectric material region F and the anti-ferroelectric material region AF include an identical base material, but may have different crystalline phases. The ferroelectric material region F and the anti-ferroelectric material region AF may include an identical material and may have different crystalline phases so that the ferroelectric material region F may exhibit a ferroelectric property and the anti-ferroelectric material region AF may exhibit an anti-ferroelectric property. For example, the ferroelectric material region F may have an orthorhombic crystalline phase, and the anti-ferroelectric material region AF may have a tetragonal crystalline phase. For example, the ferroelectric material region F and the anti-ferroelectric material region AF may include a Hf-based oxide or a Zr-based oxide. For example, an HfO-based amorphous thin film is formed and then, through annealing (heat treatment) control, a part thereof may be made into the ferroelectric material region F having an orthorhombic crystalline phase and another part thereof may be made into the anti-ferroelectric material region AF having a tetragonal crystalline phase.

The ferroelectric material region F and the anti-ferroelectric material region AF may be formed by controlling doping concentration or a dopant differently as well as the annealing (annealing) control. For example, a part of the HfO-based amorphous thin film may have a first doping concentration and the other part may have a second doping concentration and, by annealing (heat-treating) them under a certain condition, a region having the first doping concentration may be made into the ferroelectric material region F and a region having the second doping concentration may be made into the anti-ferroelectric material region AF. This effect may be obtained by using a different dopant instead of the doping concentration. Accordingly, in some cases, the ferroelectric material region F and the anti-ferroelectric material region AF may have different doping concentrations, and/or may include different dopants. When at least one of the ferroelectric material region F and the anti-ferroelectric material region AF includes a dopant, the dopant may include at least one of Si, aluminum (Al), zirconium (Zr), yttrium (Y), lanthanum (La), gadolinium (Gd), strontium (Sr), and hafnium (Hf).

In at least one example embodiment, the ferroelectric material region F and the anti-ferroelectric material region AF may have different base materials.

In the above example embodiments, a volume ratio (vol %) of the ferroelectric material region F and the anti-ferroelectric material region AF in the domain switching layers 300A to 300E may be determined within a range from about 0.1:99.9 to about 99.9:0.1. For example, the vol % of the ferroelectric material region F and the anti-ferroelectric material region AF in the domain switching layers 300A to 300E may be determined within a range from about 10:90 to about 90:10. The vol % may be determined such that the domain switching layers 300A to 300E satisfy conditions that substantially do not have hysteresis characteristics.

Figure 8:
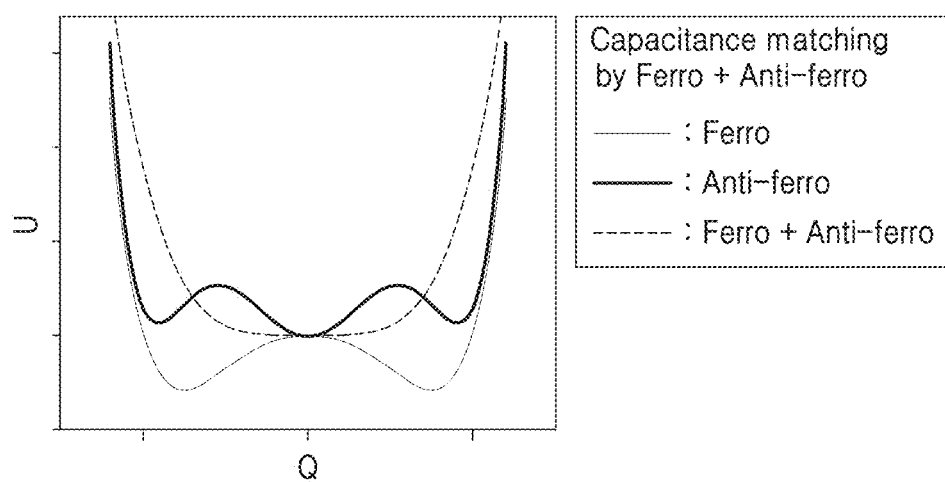
FIG. 8 is a graph illustrating an example of capacitance matching using a ferroelectric and an anti-ferroelectric in forming a domain switching layer.

FIG. 8 is a graph illustrating an example of capacitance matching using a ferroelectric and an anti-ferroelectric in forming a domain switching layer. In FIG. 8, an X axis represents a charge (Q) of a corresponding material and a Y axis represents an energy (U) of a corresponding material.

Referring to FIG. 8, the graph of a ferroelectric material (Ferro) has a well shape on both the left and right sides. The two well shapes correspond to two stable polarization states, and this graph shape represents a hysteresis behavior. There is a point in a transition region between the two wells that has a negative capacitance. Since a device according to at least one example embodiment includes a ferroelectric and utilizes a negative capacitance effect of the ferroelectric, in this respect, the device according to at least one example embodiment may be regarded as a logic switching device using the negative capacitance effect.

The graph of an anti-ferroelectric (Anti-ferro) has a different curvature from the graph of the ferroelectric (Ferro). When the ferroelectric and the anti-ferroelectric are appropriately mixed and designed, a combination (Ferro+ Anti-ferro) of the ferroelectric and the anti-ferroelectric is designed to be a U-shaped graph rather than a two-well type, and does not exhibit a substantially hysteresis behavior. In other words, capacitance matching using the ferroelectric and the anti-ferroelectric results in elimination of hysteresis.

When the domain switching layer contacts a channel region, the capacitance matching described above may be performed in consideration of a capacitance of the channel region. Furthermore, the capacitance matching may be performed in consideration of a parasitic capacitance between the channel region and source and drain. In addition, when the domain switching layer is in contact with an insulating layer (dielectric layer) below the domain switching layer, the capacitance matching may be performed in consideration of a capacitance of the insulating layer (dielectric layer). As a result, the domain switching layer may not have hysteresis by the capacitance matching.

When the domain switching layer and the channel region are in contact with each other and the capacitance matching is performed in consideration of the capacitance of the channel region, it can be said that a combination of the domain switching layer and the channel region has no hysteresis. Alternatively, in a state where the domain switching layer and the channel region are in contact with each other, it can be said that the domain switching layer has no hysteresis. Similarly, when the domain switching layer and the insulating layer (dielectric layer) are in contact with each other and the capacitance matching is performed in consideration of the capacitance of the insulating layer, it can be said that the combination of the domain switching layer and the insulating layer has no hysteresis. Alternatively, in a state where the domain switching layer and the insulating layer (dielectric layer) are in contact with each other, it can be said that the domain switching layer has no hysteresis.

Figure 9:
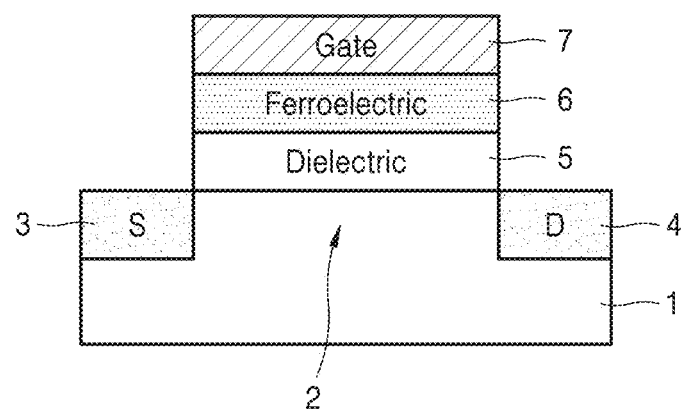
FIG. 9 is a cross-sectional view of a configuration of a device according to a comparative example.

FIG. 9 is a cross-sectional view of a configuration of a device according to a comparative example.

Referring to FIG. 9, a substrate 1 may be provided with a channel 2, a source 3, and a drain 4. A dielectric layer 5 may be on the channel 2, a ferroelectric layer 6 may be on the dielectric layer 5, and a gate electrode 7 may be on the ferroelectric layer 6. The ferroelectric layer 6 is provided between the channel 2 and the gate electrode 7 and the dielectric layer 5 is provided between the ferroelectric layer 6 and the channel 2. This comparative example shows a case where capacitance matching is performed using the ferroelectric layer 6 and the dielectric layer 5.

Figure 10:
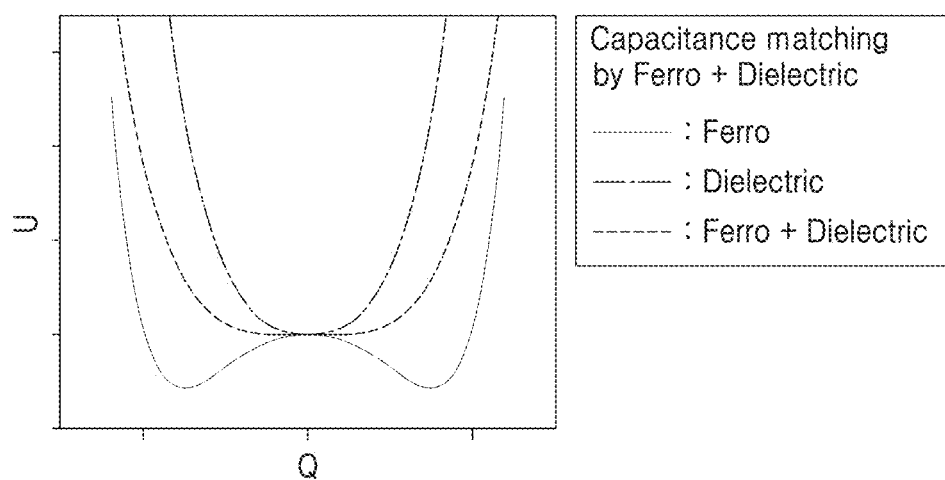
FIG. 10 is a graph illustrating capacitance matching using a ferroelectric and a dielectric according to a comparative example.
Figure 11A:
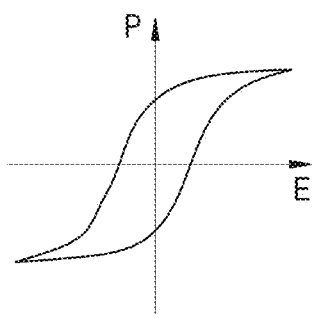
FIGS. 11A to 14B are graphs showing characteristics of a ferroelectric, an anti-ferroelectric, a combination of the ferroelectric and the anti-ferroelectric, and a dielectric, respectively.
Figure 11B:
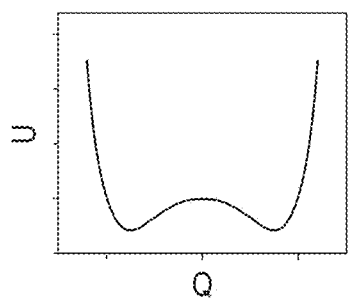
Figure 12A:
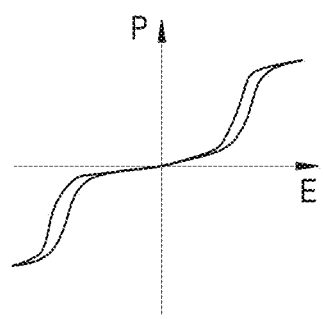
Figure 12B:
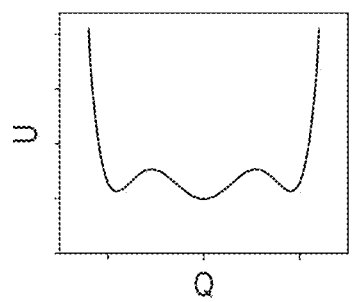
Figure 13A:
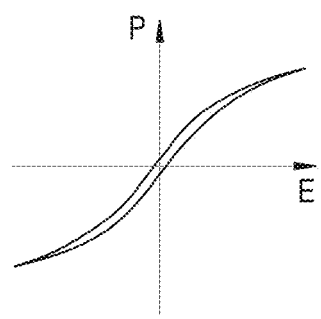
Figure 13B:
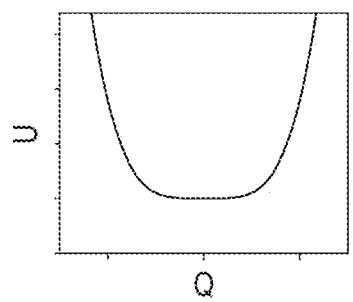
Figure 14A:
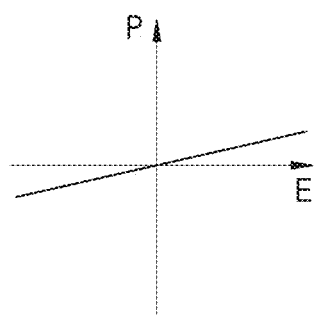
Figure 14B:
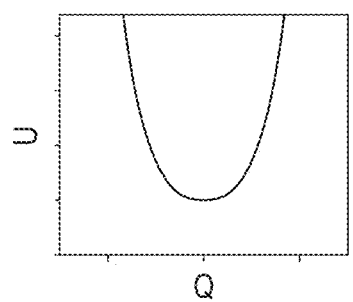

FIG. 10 is a graph illustrating capacitance matching using a ferroelectric and a dielectric according to a comparative example.

Referring to FIG. 10, the ferroelectric (Ferro) has the shape of a graph as described with reference to FIG. 8. A dielectric (Dielectric) has a shape of a relatively narrow U-shaped graph. When the ferroelectric and the dielectric are combined (Ferro+Dielectric), hysteresis is eliminated by capacitance matching, and a U-shaped graph having a relatively wide width is obtained.

However, when the capacitance matching is performed using the ferroelectric and the dielectric as in the comparative example of FIG. 10, a dielectric having a low dielectric constant is used, so that the efficiency of a gate may be reduced. In at least one example embodiment, since it is possible to eliminate the use of a dielectric material having a low dielectric constant, problems related thereto may be solved. For example, a dielectric constant of HfZrO, which may be applied to a domain switching layer in an embodiment, and a dielectric constant of $SiO_2$ used as a dielectric in a comparative example are about 50 and about 4, respectively, values which are greatly different from each other. In addition, the dielectric has no ferroelectric domain and has no domain switching during gate voltage operation. However, the anti-ferroelectric used in at least one example embodiment has a domain switching characteristic. Therefore, the SS value of a switching device is further lowered by voltage amplification that occurs at the time of domain switching. Therefore, a logic switching device that removes hysteresis through capacitance matching while increasing or maximizing a domain switching effect may be realized by combining the anti-ferroelectric and the ferroelectric.

FIGS. 11 to 14 are graphs showing characteristics of a ferroelectric, an anti-ferroelectric, a combination of the ferroelectric and the anti-ferroelectric, and a dielectric, respectively. In each of FIGS. 11 to 14, graph A shows a relationship between an electric field E and polarization P applied to a corresponding material layer, and graph B shows a relationship between a charge Q and an energy U of the corresponding material layer. For example, FIG. 13 may correspond to a characteristic of a combination (mixture) of the ferroelectric and the anti-ferroelectric applicable to a domain switching layer according to at least one example embodiment.

Figure 15:
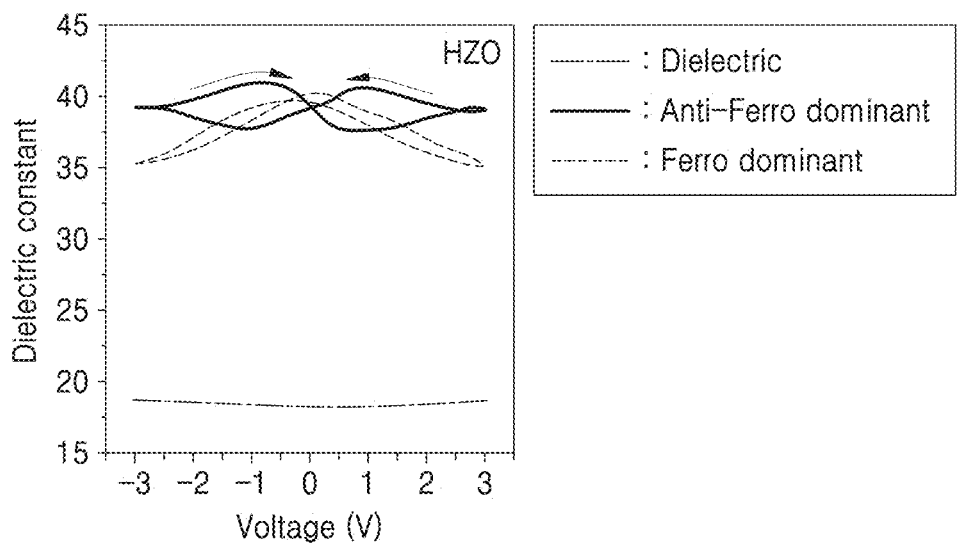
FIG. 15 is a graph showing a result of measuring dielectric constant-voltage characteristics of constitution/physical properties of an HfZrO layer of a metal/HfZrO layer/metal structure according to constitution/properties of the HfZrO layer, according to at least one example embodiment.

FIG. 15 is a graph showing a result of measuring dielectric constant-voltage characteristics of constitution/physical properties of an HfZrO layer of a metal/HfZrO layer/metal structure according to constitution/properties of the HfZrO layer, according to at least one example embodiment. FIG. 15 includes results when the HfZrO layer is a dielectric, when the HfZrO layer is in an anti-ferroelectric dominant state, and when the HfZrO layer is in a ferroelectric dominant state.

Referring to FIG. 15, an amorphous HfZrO layer that is not annealed (heat-treated) may exhibit a dielectric property, may exhibit an anti-ferroelectric dominant characteristic when the amorphous HfZrO layer is annealed under a first condition, and may exhibit a ferroelectric dominant characteristic when the amorphous HfZrO layer is annealed under a second condition. A ratio of the ferroelectric to the ferroelectric may be controlled in accordance with an annealing condition for an HfO thin film or an HfO-based thin film.

Figure 16:
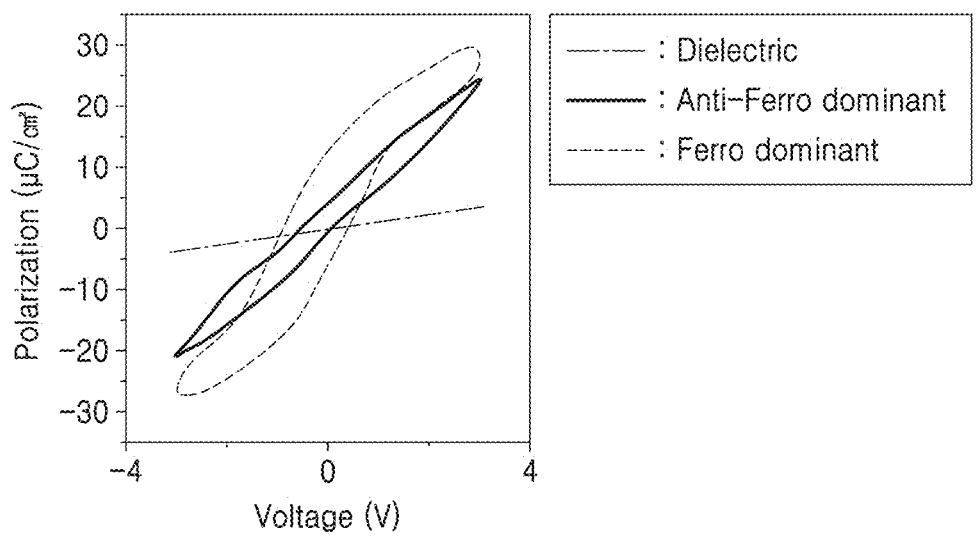
FIG. 16 is a graph showing a result of measuring polarization-voltage characteristics of the metal/HfZrO layer/metal structure described in FIG. 15, according to at least one example embodiment.

FIG. 16 is a graph showing a result of measuring polarization-voltage characteristics of the metal/HfZrO layer/metal structure described in FIG. 15, according to at least one example embodiment.

Referring to FIG. 16, remnant polarization is close to 0 and the hysteresis is also decreased in an anti-ferroelectric dominant state. However, the remnant polarization is increased to about 10 and the hysteresis is also increased in a ferroelectric dominant state.

Figure 17A:
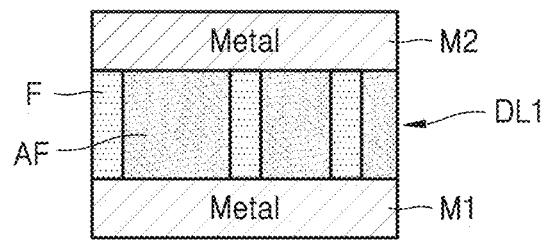
FIG. 17A is a cross-sectional view of an example of a configuration (domain arrangement) of a domain layer in an anti-ferroelectric dominant state.

FIG. 17A is a cross-sectional view of an example of a configuration (domain arrangement) of a domain layer DL1 in an anti-ferroelectric dominant state.

Figure 17B:
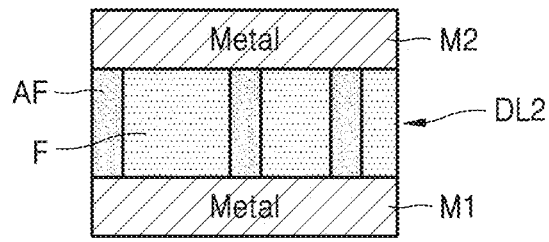
FIG. 17B is a cross-sectional view of an example of a configuration (domain arrangement) of a domain layer in a ferroelectric dominant state.

FIG. 17B is a cross-sectional view of an example of a configuration (domain arrangement) of a domain layer DL2 in a ferroelectric dominant state.

Referring to FIGS. 17A and 17B, the total volume of an anti-ferroelectric AF may be considerably greater than the total volume of the ferroelectric F in the domain layer DL1 in an anti-ferroelectric dominant state, and the total volume of the ferroelectric F may be considerably greater than the total volume of the anti-ferroelectric AF in the domain layer DL2 in the ferroelectric dominant state. Depending on an annealing condition, an orthorhombic crystal region with ferroelectric properties and a tetragonal crystal region with anti-ferroelectric properties may be mixed in a thin film. In FIGS. 17A and 17B, M1 and M2 denote metal layers.

Figure 18:
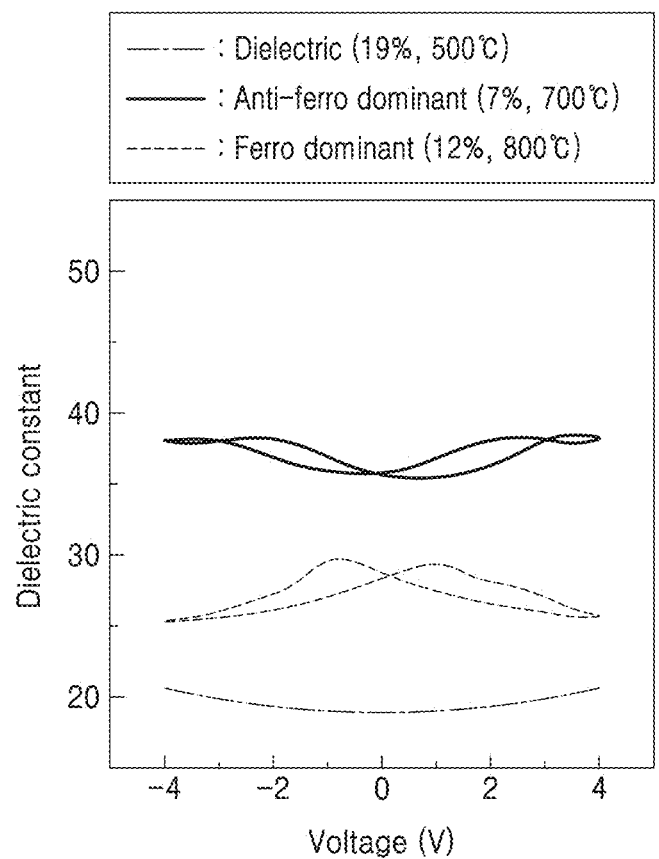
FIG. 18 is a graph showing a result of measuring dielectric constant-voltage characteristics of an Al:HfO thin film according to constitution/properties thereof, according to at least one example embodiment.

FIG. 18 is a graph showing a result of measuring dielectric constant-voltage characteristics of an Al:HfO thin film according to constitution/properties thereof, according to at least one example embodiment. FIG. 18 includes results when the Al:HfO thin film is a dielectric, when the Al:HfO thin film is in an anti-ferroelectric dominant state, and when the Al:HfO thin film is in a ferroelectric dominant state. The Al:HfO thin film represents an Al-doped HfO thin film.

Referring to FIG. 18, when a doping level of Al is 19 at % and an annealing temperature is 500° C., an Al:HfO thin film having a dielectric property may be obtained. When the doping level of Al is 7 at % and the annealing temperature is 700° C., an Al:HfO thin film having an anti-ferroelectric dominant property may be obtained. When the doping level of Al is 12 at % and the annealing temperature is 800° C., an Al:HfO thin film having a ferroelectric dominant property may be obtained. By adjusting the doping level of Al and/or an annealing condition for an amorphous Al:HfO thin film, the physical properties of the Al:HfO thin film may be changed.

Figure 19:
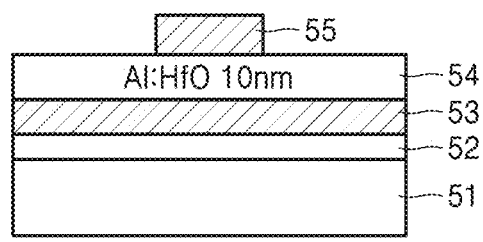
FIG. 19 is a cross-sectional view of a structure of a device used to obtain the result of FIG. 18.

FIG. 19 is a cross-sectional view of a structure of a device used to obtain the result of FIG. 18.

Referring to FIG. 19, a silicon oxide layer 52 may be formed on a silicon substrate 51, a first metal layer 53 may be formed on the silicon oxide layer 52, and an Al:HfO thin film 54 may be formed on the first metal layer 53. Next, a second metal layer 55 may be formed on the Al:HfO thin film 54. The first and second metal layers 53 and 55 may all be Mo layers, and a thickness of the Al:HfO thin film 54 may be about 10 nm. A width of the Al:HfO thin film 54 may be about 5 μm to about 400 μm.

An ferroelectric property and an anti-ferroelectric property of the Al:HfO thin film 54 may be controlled in accordance with an doping level and/or an annealing temperature of the Al:HfO thin film 54. That is, depending on the doping level and/or the annealing temperature of the Al:HfO thin film 54, the Al:HfO thin film 54 may have a dielectric property, an anti-ferroelectric dominant property, or a ferroelectric dominant property. Therefore, the ratio of a ferroelectric and an anti-ferroelectric formed in the Al:HfO thin film 54 may be controlled.

For example, properties changes according to the doping level and the annealing temperature may be summarized as shown in Table 1 below.

TABLE 1

|         | 7 at %      | 12 at %     | 19 at % | 22 at % |
|---------|-------------|-------------|---------|---------|
| 500° C. | D           | D           | D       | D       |
| 600° C. | F dominant  | D           | D       | D       |
| 700° C. | F dominant  | D           | D       | D       |
| 800° C. | F dominant  | AF dominant | D       | D       |
| 900° C. | AF dominant | AF dominant | D       | D       |

In Table 1, D indicates dielectric properties, F dominant indicates a ferroelectric dominant characteristic, and AF dominant indicates an anti-ferroelectric dominant characteristic. Depending on the materials used and the degree of doping, an appropriate annealing temperature may vary. In this regard, an annealing temperature used in manufacturing a logic switching device according to an embodiment may be about 400° C. to about 1200° C.

Figure 20:
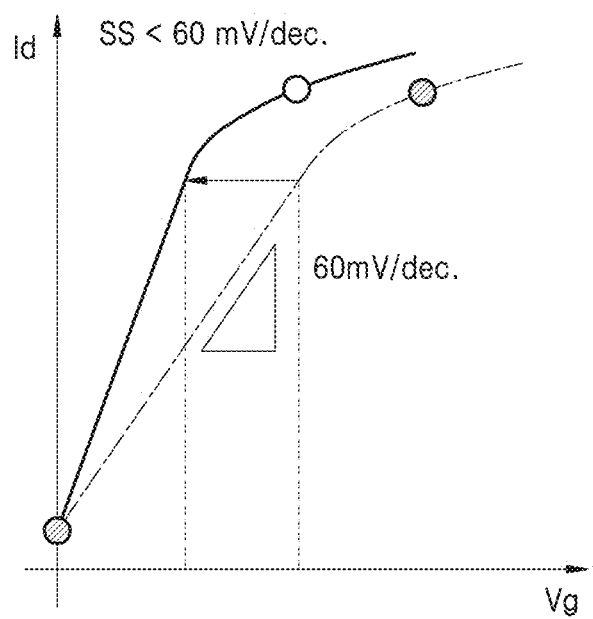
FIG. 20 is a graph for explaining an effect of improving a subthreshold swing (SS) characteristic of a logic switching device according to at least one example embodiment.

FIG. 20 is a graph for explaining an effect of improving an SS characteristic of a logic switching device according to at least one example embodiment.

Referring to FIG. 20, in the case of a conventional silicon-based transistor (a graph of a dashed line), the limit of an SS value is known to be about 60 mV/dec. However, in the case of the logic switching device according to the example embodiment (a graph of a solid line), the SS value may be reduced to about 60 mV/dec or less by a negative capacitance effect and a domain switching effect of an anti-ferroelectric.

Figure 21:
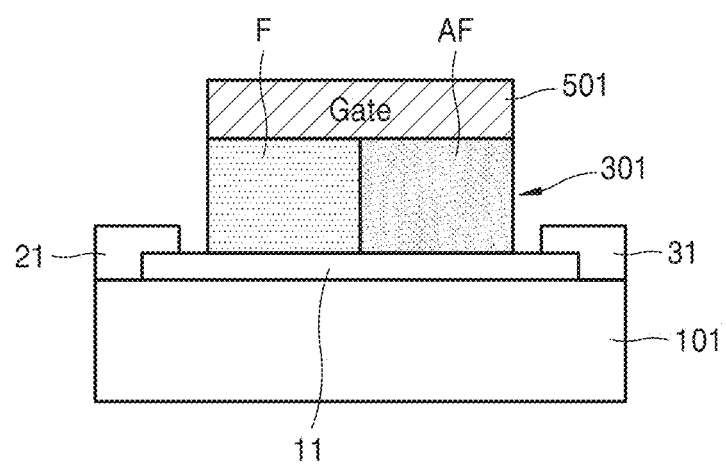
FIG. 21 is a cross-sectional view of a logic switching device according to at least one example embodiment.

FIG. 21 is a cross-sectional view of a logic switching device according to at least one example embodiment.

Referring to FIG. 21, the logic switching device may include a substrate 101 and a channel layer 11 on the substrate 101. The channel layer 11 may be a material layer (thin film) which is not part of the substrate 101 and is separate from the substrate 101. For example, the channel layer 11 may include at least one of an oxide semiconductor, a nitride semiconductor, an oxynitride semiconductor, a 2D material, a quantum dot, and an organic semiconductor. The oxide semiconductor may include, for example, InGaZnO or the like, and the 2D material may include, for example, transition metal dichalcogenide (TMD) or graphene, and the quantum dot may include a colloidal quantum dot (QD), a nanocrystal structure, or the like. However, these are merely examples and the example embodiments are not limited thereto.

The logic switching device of FIG. 21 may further include a source electrode 21 and a drain electrode 31 electrically connected to different regions of the channel layer 11. The source electrode 21 may be provided on a first end of the channel layer 11 and the drain electrode 31 may be provided on a second end of the channel layer 11. The source electrode 21 and the drain electrode 31 may include a conductive material such as a metal, a metal compound, or a conductive polymer.

The logic switching device of FIG. 21 may further include a domain switching layer 301 provided on the channel layer 11 between the source electrode 21 and the drain electrode 31. The domain switching layer 301 may be the same as or similar to the domain switching layer 300A described with reference to FIG. 1. The domain switching layer 301 may include at least one ferroelectric material region F and at least one anti-ferroelectric material region AF. A gate electrode 501 may be provided on the domain switching layer 301. The logic switching device of FIG. 21 may be modified as described with reference to FIGS. 2 to 7.

Figure 22A:
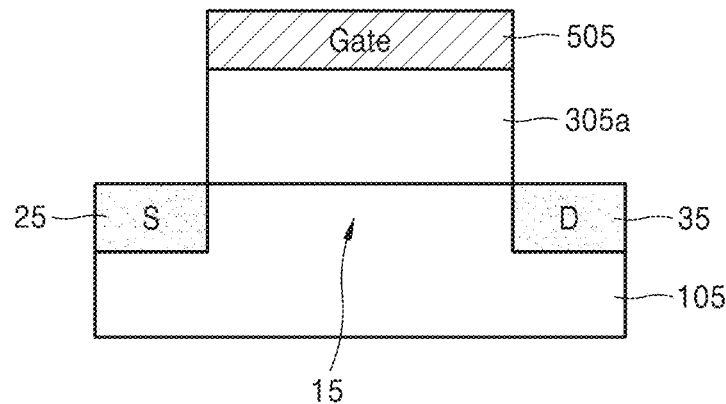
FIGS. 22A to 22C are cross-sectional views illustrating a method of manufacturing a logic switching device according to at least one example embodiment.
Figure 22B:
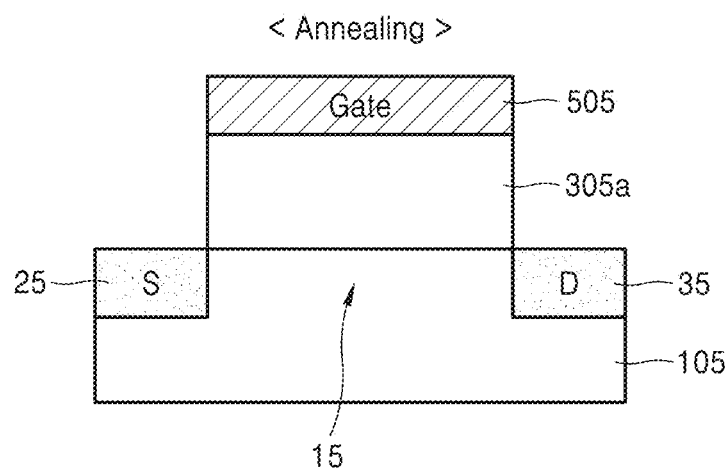
Figure 22C:
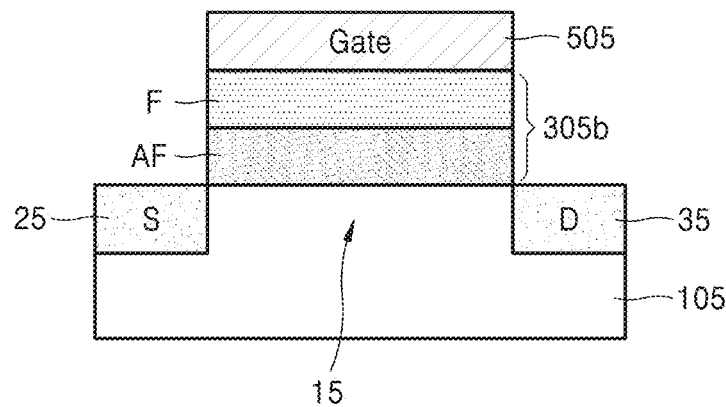

FIGS. 22A to 22C are cross-sectional views illustrating a method of manufacturing a logic switching device according to at least one example embodiment.

Referring to FIG. 22A, a substrate 105 including a channel 15 may be provided and a stack structure of an amorphous thin film 305a and a gate electrode 505 may be formed on the channel 15. An amorphous material layer and a conductive material layer are sequentially deposited on the substrate 105 and then patterned to form the amorphous material layer 305a from the amorphous material layer and the gate electrode 505 from the conductive material layer. The stack structure of the amorphous thin film 305a and the gate electrode 505 may be referred to as a 'gate stack'. The amorphous material layer may be deposited by a process such as atomic layer deposition (ALD) or chemical vapor deposition (CVD), and the conductive material layer may be deposited by a process such as ALD, CVD, or physical vapor deposition process (PVD).

The amorphous thin film 305a may be a thin film having a relatively high dielectric constant. For example, the dielectric constant of the amorphous thin film 305a may be about 10 or more. In this regard, the amorphous thin film 305a may be referred to as a high-k dielectric layer. The amorphous thin film 305a may include at least one of, for example, a Hf-based oxide and a Zr-based oxide. The Hf-based oxide may be HfO or HfZrO. The Zr-based oxide may be ZrO or the like. Here, HfO, HfZrO, and ZrO are expressed by ignoring the composition ratio of constituent elements. If necessary, the amorphous thin film 305a may further include a dopant. The dopant may include at least one of Si, Al, Zr, Y, La, Gd, Sr, and Hf. When the amorphous thin film 305a includes the dopant, the amorphous thin film 305a may be doped to the same concentration (substantially the same concentration) as a whole, or may be doped to different concentrations (levels) depending on the region. In addition, depending on the region of the amorphous thin film 305a, different dopants may be doped. Doping with respect to the amorphous thin film 305a may be performed during formation of the amorphous material layer or may be performed separately after forming the amorphous material layer.

A source 25 and a drain 35 may be formed on the substrate 105 before the amorphous thin film 305a and the gate electrode 505 are formed. The amorphous thin film 305a and the gate electrode 505 may be formed after the source 25 and the drain 35 are formed by ion-implanting a certain dopant into different regions of the substrate 105. However, a time point at which the source 25 and the drain 35 are formed may vary. The source 25 and the drain 35 may be formed in the substrate 105 after the amorphous thin film 305a and the gate electrode 505 are formed.

Referring to FIG. 22B, an annealing process for the amorphous thin film 305a may be performed. The annealing process may be performed at a temperature in the range from about 400° C. to about 1200° C. The amorphous thin film 305a may be crystallized through the annealing process and a ferroelectric material region and an anti-ferroelectric material region may be formed from the amorphous thin film 305a. When the annealing process is performed while the gate electrode 505 is in contact with the amorphous thin film 305a, crystallization of the amorphous thin film 305a may be more easily performed. A resultant product of the annealing process is shown in FIG. 22C.

Referring to FIG. 22C, a domain switching layer 305b may be formed from the amorphous thin film 305a (of FIG. 22B). The domain switching layer 305b may include at least one ferroelectric material region F and at least one anti-ferroelectric material region AF. The ferroelectric material region F and the anti-ferroelectric material region AF may have different crystalline phases. For example, the ferroelectric material region F may have an orthorhombic crystalline phase, and the anti-ferroelectric material region AF may have a tetragonal crystalline phase. The ferroelectric material region F may be provided to be in contact with the gate electrode 505 and the anti-ferroelectric material region AF may be between the ferroelectric material region F and the channel element 15. Depending on an annealing condition and the configuration of the amorphous thin film 305a (of FIG. 22B), the arrangement and arrangement relationship of the ferroelectric material region F and the anti-ferroelectric material region AF may be changed. As an example, the case where the ferroelectric material region F is provided on the anti-ferroelectric material region AF is shown, but their arrangement and arrangement relationship may be changed as described with reference to FIGS. 1 to 7.

Depending on the annealing condition, a ratio of the ferroelectric material region F and the anti-ferroelectric material region AF formed in the domain switching layer 305b may be controlled, whereby capacitance matching may be performed. Thus, the domain switching layer 305b may be a non-memory element. According to a combination of the ferroelectric material region F and the anti-ferroelectric material region AF, the domain switching layer 305b may have substantially a non-hysteretic behavior characteristic at a polarization change according to an external electric field. In other words, the domain switching layer 305b may have substantially no hysteresis characteristic. In some example embodiments, the ferroelectric material region F and the anti-ferroelectric material region AF may have different doping concentrations or may be regions doped with different dopants.

If necessary, the domain switching layer 305b may be formed through two or more deposition processes or two or more doping processes. In addition, the domain switching layer 305b may be formed through two or more annealing processes. Further, the processes of example embodiments may be modified to form various deformation structures as described with reference to FIGS. 1 to 7.

The logic switching device (logic transistor) according to example embodiments may be applied to various electronic devices, logic devices, and the like. The logic switching device (logic transistor) may be a fundamental component of various electronic devices/logic devices. According to at least one example embodiment, it is possible to implement a logic switching device with improved operating characteristics such as SS, increase control efficiency, and/or is advantageous in scaling down, so that it is possible to manufacture an electronic device/logic device having improved performance.

Figure 23:
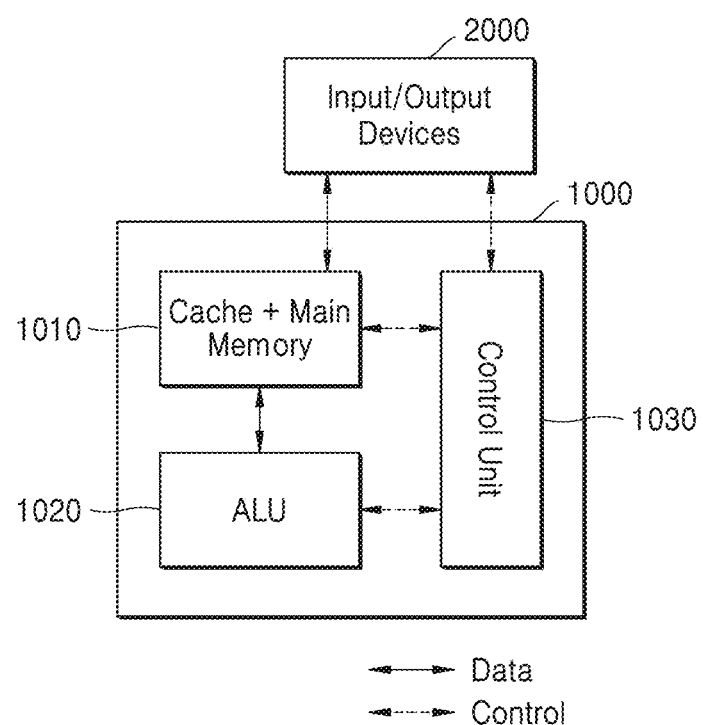
FIG. 23 is a conceptual diagram of the architecture of an electronic device according to an example embodiment.

FIG. 23 is a conceptual diagram of the architecture of an electronic device according to an embodiment.

Referring to FIG. 23, the electronic device may include a memory unit 1010, an arithmetic logic unit (ALU) 1020, and a control unit 1030, all of which may be formed in one chip 1000. The chip 1000 may be formed by monolithically integrating the memory unit 1010, the ALU 1020, and the control unit 1030 on an identical substrate. Each of the ALU 1020 and the control unit 1030 may include a 'logic switching device' according to the above-described embodiments. For example, the logic switching device may include a domain switching layer including a ferroelectric domain and having a substantially non-hysteretic behavior characteristic. The memory unit 1010 may include a memory device. For example, the memory device may include a domain layer including a ferroelectric domain and having hysteretic behavior characteristics. The memory unit 1010, the ALU 1020, and the control unit 1030 may be directly connected to each other via a metal line on-chip to communicate with each other directly. The memory unit 1010 may include both a main memory and a cache memory. The chip 1000 may be referred to as an on-chip memory processing unit. An input/output device 2000 connected to the chip 1000 may further be provided.

The electronic device of FIG. 23 may be manufactured by integrating a memory unit and a logic device unit in one chip, and therefore may be advantageous in terms of cost. Further, when the electronic device of FIG. 23 is applied to, for example, a neuromorphic device field, where the amount of data transferred between the memory unit and the logic device unit is large and data transfer is continuous, various effects such as efficiency improvement, speed improvement, and reduction of power consumption may be obtained. Since the basic construction and operation of a neuromorphic device is well known, a detailed description thereof will not be given herein.

In some cases, the electronic device according to the embodiment may be implemented as having an architecture in which computing unit devices and memory unit devices are formed adjacent to each other without distinguishing sub-units in one chip.

Figure 24:
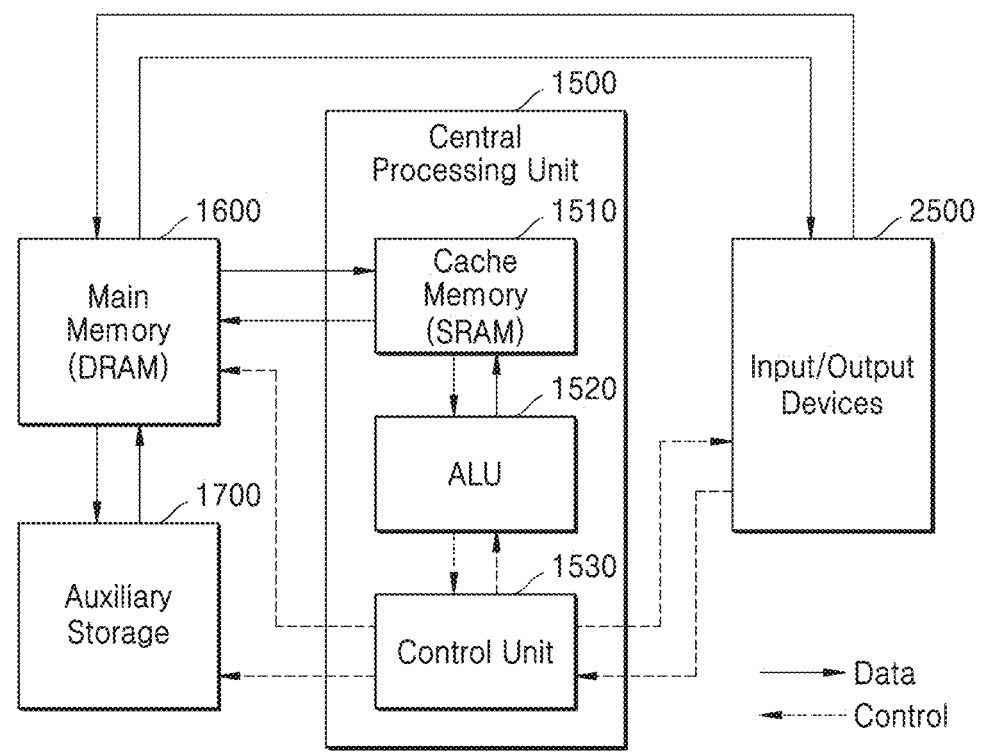
FIG. 24 is a conceptual diagram of the architecture of an electronic device according to another example embodiment.

FIG. 24 is a conceptual diagram of the architecture of an electronic device according to another example embodiment.

Referring to FIG. 24, the electronic device may include a CPU chip 1500 that may include a cache memory 1510, an ALU 1520, and a control unit 1530. Each of the ALU 1520 and the control unit 1530 may include the 'logic switching device' according to the above-described embodiments. For example, the logic switching device may include a domain switching layer including a ferroelectric domain and having a substantially non-hysteretic behavior characteristic.

The electronic device of FIG. 24 may further include a main memory 1600 and an auxiliary storage 1700, which may be provided separately from the CPU chip 1500, and an input/output device 2500. For example, the cache memory 1510 may be static random access memory (SRAM), and the main memory 1600 may be dynamic random access memory (DRAM).

At least the chip 1000 and the CPU chip 1500 may include processing circuitry such as hardware including logic circuits; a hardware/software combination such as a processor executing software; or a combination thereof.

Although a number of features have been specifically described in the above description, they should not be construed as limiting the scope of the present disclosure, but rather should be construed as example embodiments. For example, those of ordinary skill in the art will appreciate that the configurations of the logic switching devices of FIGS. 1 to 7 and 21 may be modified in various ways. In addition, it will be understood that the methods of manufacturing the logic switching device described with reference to FIGS. 22A to 22C may be variously modified. While one or more example embodiments have been described with reference to the figures, it will be understood by those of ordinary skill in the art that various changes in form and details may be made therein without departing from the spirit and scope as defined by the following claims.

What is claimed is:

1. A semiconductor device comprising:
a channel;
a source and a drain both connected to the channel;
a gate electrode arranged to face the channel; and
an oxide layer between the channel and the gate electrode, the oxide layer comprising a first region and a second region,
wherein the first region and the second region comprise a substantially identical base material which includes a hafnium-based oxide material, a zirconium-based oxide material, or a combination thereof,
the first region comprises an orthorhombic crystalline phase and the second region comprises a tetragonal crystalline phase, and
wherein the semiconductor device has a substantially non-hysteretic behavior characteristic at a polarization change according to an external electric field.

2. The semiconductor device of claim 1, wherein the first region and the second region are positioned in a plane.

3. The semiconductor device of claim 1, wherein the first region and the second region are arranged in a direction parallel to the gate electrode.

4. The semiconductor device of claim 1, wherein the first region and the second region are arranged in a direction perpendicular to the gate electrode.

5. The semiconductor device of claim 1, wherein the first region and the second region have different doping concentrations.

6. The semiconductor device of claim 1, wherein at least one of the first region and the second region comprises a dopant.

7. The semiconductor device of claim 6, wherein the dopant comprises at least one selected from a group consisting of silicon, aluminum, zirconium, yttrium, lanthanum, gadolinium, strontium, hafnium, and combination thereof.

8. The semiconductor device of claim 1, the first region and the second region comprise different dopants.

9. The semiconductor device of claim 1, wherein a volume ratio of the first region to the second region in the oxide layers is in a range from about 10:90 to about 90:10.

10. The semiconductor device of claim 1, wherein the oxide layer is in direct contact with the channel.

11. The semiconductor device of claim 1, further comprising:
an insulating layer between the channel and the oxide layer;
a conductive layer between the insulating layer and the oxide layer; or both of them.

12. A semiconductor device comprising:
a channel;
a source and a drain both connected to the channel;
a gate electrode arranged to face the channel; and
an oxide layer between the channel and the gate electrode, the oxide layer comprising a first region and a second region,
wherein the first region and the second region comprises a substantially identical base material which includes a hafnium-based oxide material, a zirconium-based oxide material, or a combination thereof and have different crystalline phases,
wherein the semiconductor device has a substantially non-hysteretic behavior characteristic at a polarization change according to an external electric field.

13. The semiconductor device of claim 12, wherein the first region comprises an orthorhombic crystalline phase and the second region comprises a non-orthorhombic crystalline phase.

14. The semiconductor device of claim 12, wherein the first region and the second region are positioned in a plane.

15. The semiconductor device of claim 12, wherein the first region and the second region are arranged in a direction parallel to the gate electrode.

16. The semiconductor device of claim 12, wherein a volume ratio of the first region to the second region in the oxide layers is in a range from about 10:90 to about 90:10.

17. The semiconductor device of claim 12, wherein at least one of the first region and the second region comprises a dopant.

18. The semiconductor device of claim 17, wherein the dopant comprises at least one selected from a group consisting of silicon, aluminum, zirconium, yttrium, lanthanum, gadolinium, strontium, hafnium, and combination thereof.

19. The semiconductor device of claim 12, wherein the first region and the second region have different doping concentrations.

20. The semiconductor device of claim 12, the first region and the second region comprise different dopants.

21. An electronic device comprising the semiconductor device of claim 1.

22. An electronic device, comprising:
at least one of a memory unit; an arithmetic logic unit (ALU); and a control unit; and
wherein the at least one of the memory unit; the arithmetic logic unit (ALU); and the control unit include the semiconductor device of claim 1.

23. An electronic device comprising the semiconductor device of claim 12.

24. An electronic device, comprising:
at least one of a memory unit; an arithmetic logic unit (ALU); and a control unit; and
wherein the at least one of the memory unit; the arithmetic logic unit (ALU); and the control unit include the semiconductor device of claim 12.

* * * * *